US006826717B1

(12) United States Patent
Draper et al.

(10) Patent No.: US 6,826,717 B1
(45) Date of Patent: Nov. 30, 2004

(54) SYNCHRONIZATION OF HARDWARE AND SOFTWARE DEBUGGERS

(75) Inventors: Andrew Draper, Chesham (GB); Edward Flaherty, Rimes Cottage (GB)

(73) Assignee: Altera Corporation, San Jose, CA (US)

( * ) Notice: Subject to any disclaimer, the term of this patent is extended or adjusted under 35 U.S.C. 154(b) by 445 days.

(21) Appl. No.: 09/880,692

(22) Filed: Jun. 12, 2001

Related U.S. Application Data

(60) Provisional application No. 60/211,094, filed on Jun. 12, 2000.

(51) Int. Cl.[7] .............................................. G06F 11/00
(52) U.S. Cl. ........................................ 714/39; 714/725
(58) Field of Search ........................... 714/39, 30, 725; 703/28; 326/39

(56) References Cited

U.S. PATENT DOCUMENTS

| | | | |
|---|---|---|---|
| 5,425,036 A | * 6/1995 | Liu et al. ..................... | 714/735 |
| 5,717,699 A | * 2/1998 | Haag et al. .................. | 714/725 |
| 5,960,191 A | * 9/1999 | Sample et al. ................ | 703/28 |
| 5,995,744 A | 11/1999 | Guccione .................... | 395/500 |
| 6,016,563 A | * 1/2000 | Fleisher ...................... | 714/725 |
| 6,259,271 B1 | * 7/2001 | Couts-Martin et al. ....... | 326/40 |
| 6,389,558 B1 | * 5/2002 | Herrmann et al. ............ | 714/39 |
| 6,408,432 B1 | * 6/2002 | Herrmann et al. .......... | 717/139 |
| 6,425,077 B1 | * 7/2002 | Le et al. ......................... | 713/1 |
| 6,460,148 B2 | * 10/2002 | Veenstra et al. .............. | 714/39 |
| 6,481,000 B1 | * 11/2002 | Zaveri et al. ................. | 716/17 |
| 2003/0078752 A1 | * 4/2003 | Allamsetty .................. | 702/120 |

\* cited by examiner

Primary Examiner—Scott Baderman
(74) Attorney, Agent, or Firm—Beyer, Weaver & Thomas, LLP.

(57) ABSTRACT

A technique synchronizes logic signals captured in a PLD portion of a PLD system having both a microprocessor and PLD circuitry with executed instructions captured from a microprocessor portion. One or more signal lines connects the microcontroller portion with the PLD portion for transmitting signals between the two portions corresponding to debug operations in each portion.

Conventional electronic circuits employing microprocessors and PLD's use independent debugging techniques, either of which are incapable of reflecting the complete state of the circuit at a selected time. Combined processor and PLD systems employ independent clocks for each portion, thus creating additional problems in synchronizing logic state traces in the PLD with the microprocessor instruction traces. The present invention provides a direct signals from the PLD portion to the microcontroller portion upon the occurrence of events relating to debugging and debug modes of the microprocessor. In one embodiment, the PLD portion is configured to send the output from a counter to a trace module in the microcontroller portion. The periodic and variably valued output signal from the PLD portion enables software in an external host computer connected to the combined circuit to match a debug trace from the microprocessor to selected events occurring within the PLD portion. In another embodiment, a signal is transmitted from the microcontroller portion to the PLD portion and an embedded logic analyzer is configured to respond to the signal by performing a post-trigger scan. This scan captures the states of selected logic in the PLD portion and may provide the data to a user through software operating on a host computer connected to the PLD portion, often through a JTAG port.

39 Claims, 7 Drawing Sheets

SYNCHRONIZATION OF HARDWARE AND SOFTWARE DEBUGGERS

This application claims priority of U.S. provisional patent application No. 60/211,094, filed Jun. 12, 2000, entitled "Programmable Logic Integrated Circuit with Embedded Processor" which is incorporated by reference. This application is related to U.S. Pat. No. 6,182,247, entitled "Embedded Logic Analyzer For A Programmable Logic Device"; U.S. patent application Ser. No. 09/186,607, filed Nov. 6, 1998, entitled "Enhanced Embedded Logic Analyzer" now U.S. Pat. No. 6,286,114; and U.S. Pat. No. 6,247,147, entitled "Enhanced Embedded Logic Analyzer"; all of which are hereby incorporated by reference.

FIELD OF THE INVENTION

The present invention relates generally to analysis and debugging of integrated circuit devices. More specifically, the present invention relates to synchronizing the debugging of a processor and a PLD embedded on a common chip.

BACKGROUND OF THE INVENTION

Since their inception, digital systems have progressed towards higher levels of integration. Higher integration produces several benefits including increased performance and lower development costs. At the device level integration has been achieved by combining functions once performed by multiple individual devices into higher density devices with greater capabilities.

Architectural and process enhancements as well as incorporation of memory onboard the microprocessor chip have permitted microprocessors to operate at higher speeds and with greater capabilities. Likewise, programmable logic devices have matured to meet customer's expectations of greater capacity and performance through increases in size and density and by changes in architecture. Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. The increased size and capabilities of the devices, with their corresponding complexities, has resulted in movement towards higher levels of abstraction in the design development of microprocessors and programmable logic devices. Programming languages used in conjunction with the design development of microprocessor circuits have evolved towards languages using higher levels of abstraction, such as C, C++, and JAVA. High level hardware description languages, including Verilog and VHDL, are typically employed to develop designs in programmable logic devices. The increased complexity of these devices has also resulted in increased reliance on design verification through on-chip debugging tools. Such tools as Background Debug Mode, Enhanced JTAG, and N-Wire are used in debugging microprocessors.

Traditional design approaches include combining a microprocessor with off-the-shelf devices on a system board. This approach presents problems such as increased delay from signals travelling off chip to other devices and increased power consumption. On the other hand, integrating an embedded processor with programmable logic within a PLD provides several advantages in addition to increased performance. Flexibility is given to the designer to determine which functions should be executed in software (by the processor) and which would benefit form hardware implementation in the PLD. Debugging such a system on a programmable chip ("SOPC") presents unique problems best described after a more detailed description of conventional debugging approaches for PLD's and microprocessors (software debugging).

In the field of electronics, various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits (e.g., ASICs), and in the design of custom configurations for programmable integrated circuits. Integrated circuits that may be programmable by a customer to produce a custom design for that customer include programmable logic devices (PLDs). Often, such PLDs are designed and programmed by a design engineer using an electronic design automation tool that takes the form of a software package. These tools commonly offer the designer the option of inputting the design in at least one high level hardware description language.

In the course of generating a design for a PLD, programming the PLD and checking its functionality on the circuit board or in the system for which it is intended, it is important to be able to debug the PLD because a design is not always perfect the first time. Before a PLD is actually programmed with an electronic design, a simulation and/or timing analysis may be used to debug the electronic design. However, once the PLD has been programmed and is operating within a working system, it is also important to be able to debug the PLD in this real-world environment.

And although a simulation may be used to debug many aspects of a PLD, it is nearly impossible to generate a simulation that will accurately exercise all of the features of the PLD on an actual circuit board operating in a complex system. For example, a simulation may not be able to provide timing characteristics that are similar to those that will actually be experienced by the PLD in a running system; e.g., simulation timing signals may be closer or farther apart than what a PLD will actually experience in a real system.

In addition to the difficulties in generating a comprehensive simulation, other circuit board variables such as temperature changes, capacitance, noise, and other factors may cause intermittent failures in a PLD that are only evident when the PLD is operating within a working system. Still further, it can be difficult to generate sufficiently varied test vectors to stress the PLD design to the point where most bugs are likely to be observed. For example, a PLD malfunction can result when the PLD is presented with stimuli that the designer did not expect, and therefore did not take into account during the design and simulation of the PLD. Such malfunctions are difficult to anticipate and must be debugged in the context of the complete system. Thus, simulation of an electronic design is useful, but usually cannot debug a PLD completely.

One approach to debugging a hardware device within a working system is to use a separate piece of hardware equipment called a logic analyzer to analyze signals present on the pins of a hardware device. (For example, the HP1670A Series Logic Analyzer from Hewlett-Packard Company.) Typically, a number of probe wires are connected manually from the logic analyzer to pins of interest on the hardware device in order to monitor signals on those pins. The logic analyzer captures and stores these signals. However, the use of an external logic analyzer to monitor pins of a hardware device has certain limitations when it comes to debugging such a device. For example, such an external logic analyzer can only connect to and monitor the external pins of the hardware device. Thus, there is no way to connect to and monitor signals that are internal to the hardware device. Unfortunately, when programming a hardware device such as a PLD, it would be useful to be able to monitor some of these internal signals in order to debug the PLD.

Although some custom hardware devices may come ready made with some internal debugging hardware, this debugging hardware is typically hardwired to route specific internal signals and cannot be readily changed by an engineer who wishes to look at other signals. Also, with such built-in debugging it is not possible to choose any signal to monitor that the engineer desires, nor can triggering signals and triggering conditions be changed by the engineer. Because a PLD by its very nature is a programmable device that an engineer is attempting to program to perform a particular function, it is important to the engineer to be able to customize monitored signals, trigger signals, and trigger conditions in order to efficiently debug any particular device. Further, creating an electronic design for a PLD is an iterative process that requires creative debugging by an engineer who may wish to view almost any internal signal, and who may change his mind fairly frequently in the course of debugging a PLD within a system. Known external and internal logic analyzers do not provide this flexibility.

A further drawback to using an external logic analyzer or hardwired predetermined debugging hardware inside of a custom chip is that often the number of internal signals that an engineer desires to monitor are greater than the number of available pins on the device. For example, if there are sixteen internal signals that an engineer wishes to monitor on a device, he is unable to do this using an external logic analyzer if the device has only four pins available for debugging.

In some cases, it is possible for an engineer to employ a conventional logic analyzer to study an internal signal of a PLD. This may be accomplished by, for example, an engineer modifying his design so that a normally internal signal is routed temporarily to an output pin of the PLD. The design is then recompiled. The engineer then attaches a probe to this output pin in order to monitor the "internal" signal. Unfortunately, the engineer must recompile his design and reprogram the PLD in order to view this internal signal. Also, when debugging is complete, the engineer must again rewrite the design to remove the internal signal from the output pin, recompile the design and finally reprogram the PLD again. This can be a tedious process.

Even if an engineer is successful in routing an internal signal to an output pin of a PLD, with certain integrated circuit packages it may be extremely difficult to attach an external logic analyzer. For an integrated circuit in a dual in-line package it may be relatively straightforward to attach the probes of a logic analyzer to the top of the package as long as the package is in an easily accessible location on a circuit board. However, if the package is in a difficult to reach location because of device crowding, it may be difficult to physically attach logic analyzer probes to particular output pins of interest. Even more troublesome are integrated circuits with rows of miniature contacts located on the top of the package (e.g., "flip chips"). It is difficult to attach logic analyzer probes to particular outputs of interest with this type of package. Some integrated circuit are encased in a ball grid array package with the contacts located on the bottom of the package up against the circuit board; for these packages, it may be nearly impossible to attach logic analyzer probes to these small contacts located on the underside of the package. Thus, use of an external logic analyzer has shortcomings even if an internal signal can be routed to a pin of a device.

U.S. patent application Ser. No. 08/958,435 entitled "Embedded Logic Analyzer For A Programmable Logic Device" discloses an advantageous apparatus and techniques that allow an embedded logic analyzer to flexibly analyze internal signals of interest in an electronic design, such as within a programmable logic device (PLD). Nevertheless, there is room for improvement in the analysis of internal signals of a PLD for debugging purposes.

For example, some logic analyzers allow a user to specify a trigger condition and a set of trigger signals that must satisfy that trigger condition before the logic analyzer is triggered into the capture of data. Such logic analyzers are useful when it is desirable to capture and analyze signal data that occurs immediately after a particular trigger condition (such as a failure of the device). It is often desirable, however, to capture signals for later analysis that occur before the trigger condition. For the most part, these logic analyzers that begin data capture based upon satisfaction of a trigger condition are unable to provide captured signals before the trigger condition because the logic analyzer is only designed to begin capture upon an error, failure or other trigger condition. Because these errors and/or failures are unanticipated, these type of logic analyzers are unable to anticipate the trigger condition, and hence, are unable to begin capturing data before the trigger condition occurs.

In some debugging situations, it can be extremely advantageous to capture signals that occur before the trigger conditions occurs. For example, when debugging a PCI bus interface, a situation may occur in which the interface enters an illegal state. Traditional logic analyzers would be able to detect that illegal state and immediately begin capturing signal data for later analysis. It would be extremely desirable, however, to begin capturing signal data before the bus interface enters the illegal state in order to determine why the bus has entered this illegal state. In another example, when an interrupt occurs, it can be extremely desirable to know the history of certain registers before the interrupt occurs. In other words, once the interrupt is received, data capture may begin, but the registers may already be in an incorrect state. It would be extremely desirable to be able to capture and analyze signal data before the interrupt occurs in order to determine why certain registers are in an incorrect state when the interrupt occurs. Other situations in which it would be desirable to capture signal data before a specific trigger condition are also possible.

Various prior art efforts present partial solutions, but each have their drawbacks. For example, external logic analyzers available from the Hewlett-Packard Company allow capture of signal data before a trigger condition (or breakpoint) occurs. Unfortunately, these external logic analyzers suffer from many of the disadvantages associated with external logic analyzers discussed above. Actel Corporation of Sunnyvale, Calif. provides two probes within a programmable logic device that are able to monitor two different signals, but these signals must be prespecified by the user and may not be flexibly reassigned to other signals. In addition, the Actel probes provide constant monitoring of particular signals, but do not allow capture of relevant signal data in relation to a specified breakpoint.

As described earlier in this section, a design engineer designs a PLD and programs such a device using an electronic design automation tool. In the course of this design phase, the design engineer may perform numerous design-program-debug iterations before the design is complete and the PLD ready for mass manufacturing. The design engineer often uses a simulation and/or a timing analysis to assist in debugging the electronic design of the PLD. It is also conceivable that a design engineer would use an embedded logic analyzer (such as disclosed in U.S. patent application Ser. No. 08/958,435) to troubleshoot the design. Once the design of the PLD is complete to the design engineer's satisfaction, the design is handed off to a product engineer for the manufacturing phase.

In the manufacturing phase, a product engineer designs a manufacturing flow for the mass production of an electronic circuit board or other electronic device that incorporates one or more PLDs. During the manufacturing phase, it will be necessary to test the board itself and may also be necessary to retest the PLD. In the beginning of the manufacturing phase, any number and type of hardware components and any number of PLDs are soldered to a board. Once on the board, a PLD is most often programmed (or configured) using a JTAG port located on the PLD. It is also possible that a particular PLD be programmed by itself before placement on a board using a special socket and a programming unit.

A full board test may then be performed to test the traces, solder connections, and other physical interfaces between components on the board. It should be pointed out that a board test may also be performed before any devices on the board are programmed or configured. It is common to use a JTAG port of a PLD or other device to test the traces and solder connections of a board during this board test. Once physical connections are tested, a complete functional test of the board is then formed to test the overall functionality of the board (i.e., to ensure that particular inputs produce the outputs expected). At this point, if a failure is detected it may be necessary to debug a particular PLD while on the board. For failures more difficult to track down, it may even be necessary to remove a PLD from the board to be debugged. In these circumstances, as previously explained, it is desirable to have an embedded logic analyzer within the PLD to facilitate debugging. During any debugging of the PLD using an embedded logic analyzer, it is necessary in some fashion to control the embedded logic analyzer, i.e., to provide it with commands and data and to receive captured data and status from it.

For example, it may be possible to use existing input/output pins of a device to provide a control interface. Unfortunately, a particular design may not have enough extra input/output pins available through which an interface can be provided to control an embedded logic analyzer. It can be undesirable to require that a customer purchasing a PLD not use a certain number of input/output pins simply because the PLD may not have been designed correctly and might have to be debugged at some point.

Embedded logic analyzers placed in the programmable logic device permit capture of specified signal data both before and after a specified breakpoint. However, such embedded analyzers have typically been designed to measure signal levels at various internal: and external circuit nodes within the PLD. Their signal acquisition capabilities do not extend to the states in the software environment of the processor.

Software debug support is particularly useful with embedded processors. In contrast to the signals measured by logic analyzers in a PLD, the state of the microprocessor at the time of a system stoppage can be examined post stop. A debug feature such as single-step may be used to look at the contents of memory accessible by the processor and registers as well as the changes in values at these locations. Through the use of the debugger, values in memory and registers may be modified and followed by a restart of the processor. Breakpoints may be inserted by the debugger (as controlled from the host computer) into points of interest in the program, i.e. where the program is about to perform improperly or has performed improperly. The user may then single step through the program, i.e. use the debugger to execute one instruction at a time, watching the values in registers and memory locations at each step. Debugging may also be used, once a breakpoint is reached, to allow the user to examine the states of all registers and memories leading up to the system stoppage to obtain a more complete picture of the events leading to the system failure.

One type of breakpoint is inserted by a special unit that stops the processor when it is about to execute an instruction at a particular address. A second type of breakpoint involves replacing one of the instructions in the program with a breakpoint.

Extra information can be obtained by analysis of the instructions executed immediately before the system stoppage. Captured software trace data reflects the executed instructions in a processor prior to a trigger. In one approach, a trace capture unit operates in combination with a main processor. The main processor fetches instructions while the trace capture unit monitors fetched instructions and data on the bus and sends the information to the host computer typically in a compressed form. The amount of and format of trace information supplied is typically controlled through a JTAG (Joint Test Action Group) port to an external host computer.

These approaches are not optimal because generally they capture no information about the states in peripherals or other circuitry such as a PLD connected to the processor.

Intel Corporation of Santa Clara, Calif. uses a JTAG port to control access to specified debug registers for help in debugging a central processing unit (CPU). Because a CPU is a known design, it is known beforehand exactly how many debug registers will be needed and control is simplified. With a PLD, however, each user-implemented design will be custom; it is unknown ahead of time what that design will be and how many debug registers might be needed. Those devices that include both a micro processor and a PLD are a greater challenge.

Debugging a chip which combines both a microprocessor and a PLD presents problems which have heretofore been unaddressed. When execution of instructions in the microprocessor comes to a halt, either through program failure or through activation of a breakpoint in debugging software, the operations in the PLD logic will continue indefinitely. Thus, the logic states observed in the PLD at the time that execution terminates will be different from the states (of instructions) observed on the processor side at the time that the system fault occurred. This incongruence between states may also occur when a fault in the PLD side occurs. Although debugging trace results can be obtained independently for the microprocessor and the PLD, there is a need for matching those results so that the states of the entire system, including the microprocessor instructions and the PLD logic signals, can be inspected at the time of the system fault.

The microprocessor portion of the chip will typically have an optimal clock speed different from the maximum clock speed of the PLD. This means each of the portions will operate at different speeds and the traces for each of the portions will have different clock periods. This adds to the difficulties in attempting to get a complete picture of the states of the PLD logic and the processor instructions at selected times during the debugging process. Therefore, what is further needed is a method of synchronizing debugging trace results for both the microprocessor and the PLD logic so that the states of the entire system at a trigger time and a selected period before or after the trigger may be accurately analyzed.

SUMMARY OF THE INVENTION

To achieve the foregoing, and in accordance with the purpose of the present invention, a technique and electronic device for synchronizing logic signals captured in a PLD portion of a PLD system having both a microprocessor and PLD circuitry with executed instructions captured from a microprocessor portion, is disclosed. One or more signal lines connects the microcontroller portion with the PLD portion for transmitting signals between the two portions corresponding to debug operations in each portion.

Combined processor and PLD systems employ independent clocks for each portion to optimize performance of each portion. Although software debuggers are commercially available and capable of capturing and storing thousands of instructions in accordance with the available memory, they have no capability of storing the states present in the PLD logic. Embedded logic analyzers such as Altera's Signal Tap are capable of storing signal values for selected logic circuit points but are incapable of capturing and storing the executed instructions in the associated embedded microprocessor. The present invention solves these problems by providing a direct signal from the PLD portion to the microcontroller portion upon the occurrence of events relating to debugging and debug modes of the microprocesssor. In one embodiment, the PLD portion is configured to send the output from a counter to a trace module in the microcontroller portion in order to perform synchronization. The periodic and variably valued output signal from the PLD portion enables software in an external host computer connected to the combined circuit to match a debug trace from the microprocessor to selected events occurring within the PLD portion. In another embodiment, a signal is transmitted from the microcontroller portion to the PLD portion and an embedded logic analyzer is configured to respond to the signal by performing a post-trigger capture trace. This trace captures the states of selected logic in the PLD portion and may provide the data to a user through software operating on a host computer connected to the PLD portion, often through a JTAG port.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1:
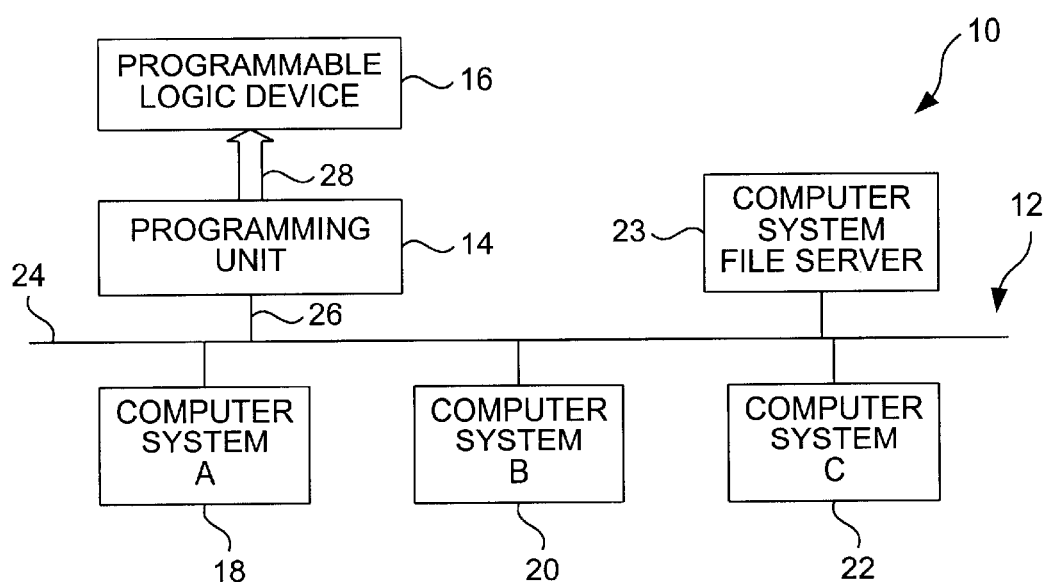
FIG. 1 is a block diagram of a programmable logic development system according to one embodiment of the present invention.

Combining a processor portion with a programmable logic device portion ("PLD") on an integrated circuit provides many advantages to the user in terms of performance and development costs but creates unique problems in debugging. For efficient operation, a microprocessor may in many instances provide data to the associated PLD portion, move on to another task and return to obtain the processed data from the PLD portion. When a fault occurs in the execution of instructions and produces an unexpected delay in the execution of instructions, the processed data in the PLD may reflect values that do not properly correspond to the intermediate results expected by the processor. The unequal delays in the PLD portion and the microcontroller circuit cause a race condition, resulting in incorrect performance by the circuit. In order to debug such a combined circuit, information as to the states of instructions in the embedded processor and the logic values in the PLD portion is desirable in order to obtain a complete snapshot of the circuit at the time of failure. Debugging is typically performed by the use of software implemented on a host computer connected to the circuits subject to examination.

Combined processor and PLD systems employ independent clocks for each portion to optimize performance of each portion. Although software debuggers are commercially available and capable of capturing and storing thousands of instructions in accordance with the available memory, they have no capability of storing the states present in the PLD logic. Embedded logic analyzers such as Altera's Signal Tap are capable of storing signal values for selected logic circuit points but are incapable of capturing and storing the executed instructions in the associated embedded microprocessor. The present invention solves these problems by providing a direct signal from the PLD portion to the microcontroller portion upon the occurrence of events relating to debugging and debug modes of the microprocessor. In one embodiment, the PLD portion is configured to send the output from a counter to a trace module in the microcontroller portion. The periodic and variably valued output signal from the PLD portion enables software in an external host computer connected to the combined circuit to match a debug trace from the microprocessor to selected events occurring within the PLD portion. In another embodiment, a signal is transmitted from the microcontroller portion to the PLD portion and an embedded logic analyzer is configured to respond to the signal by performing a post-trigger scan. This scan captures the states of selected logic in the PLD portion and may provide the data to a user through software operating on a host computer connected to the PLD portion, often through a JTAG port.

Configuring the PLD portion is typically performed through the assistance of electronic design automation (EDA) software. In order to develop a design for programming an electronic design such as a programmable logic device, a programmable logic development system is used. As used herein, "electronic design" refers to circuit boards and systems including multiple electronic devices and multi-chip modules, as well as integrated circuits. For convenience, the following discussion will generally refer to "integrated circuits", or to "PLDs", although the invention is not so limited.

Programmable Logic Development System

FIG. 1 is a block diagram of an embodiment of a programmable logic development system 10 that includes a computer network 12, a programming unit 14 and a programmable logic device 16 that is to be programmed. Computer network 12 includes any number of computers connected in a network such as computer system A 18, computer system B 20, computer system C 22 and computer system file server 23 all connected together through a network connection 24. Computer network 12 is connected via a cable 26 to programming unit 14, which in turn is connected via a programming cable 28 to the PLD 16. Alternatively, only one computer system could be directly connected to programming unit 14. Furthermore, computer network 12 need not be connected to programming unit 14 at all times, such as when a design is being developed, but could be connected only when PLD 16 is to be programmed.

Programming unit 14 may be any suitable hardware programming unit that accepts program instructions from computer network 12 in order to program PLD 16. By way of example, programming unit 14 may include an add-on logic programmer card for a computer, and a master programming unit, such as are available from Altera Corporation of San Jose, Calif. PLD 16 may be present in a system or in a programming station. In operation, any number of engineers use computer network 12 in order to develop programming instructions using an electronic design automation software tool. Once a design has been developed and entered by the engineers, the design is compiled and verified before being downloaded to the programming unit. The programming unit 14 is then able to use the downloaded design in order to program PLD 16.

For the purposes of debugging a PLD according to an embodiment of the present invention, any of the computers shown or others may be used to specify a logic analyzer circuit and to compile such circuit along with a user's design. Furthermore, programming cable 28 may be used to control the logic analyzer and to receive data from it, or a separate debugging cable may be used to directly connect a computer with device 16. Programming cable 28 may also be used to program instructions into the embedded processor in a combined PLD, processor core, and memory system such as Altera's Excalibur embedded processor system.

Such a programmable logic development system is used to create an electronic design. Design entry and processing occurs in the context of a "project". A project includes a project file, design files, assignment files, and simulation files, together with hierarchy information, system settings, and output files, which includes programming files and report files. A project database may also exist, which contains intermediate data structures and version information.

A project contains one or more hierarchies of design entities and each design hierarchy tree has a root entity, which is the topmost design entity in that hierarchy tree (the top-level functional block). Other design entities in the design hierarchy tree are called child entities. Also, a design hierarchy may contain entities for which there is no corresponding design file, for example, in a top-down design methodology. That part of a hierarchy which contains such not-yet-implemented entities is not compiled or simulated until a design file is supplied for each entity. In this case, template source files are automatically generated which have defined interfaces but empty bodies to assist in implementing these parts of a project. A user creates a design by specifying and implementing functional blocks, as will now be described in the context of an exemplary design methodology.

Design Methodology

Figure 2:
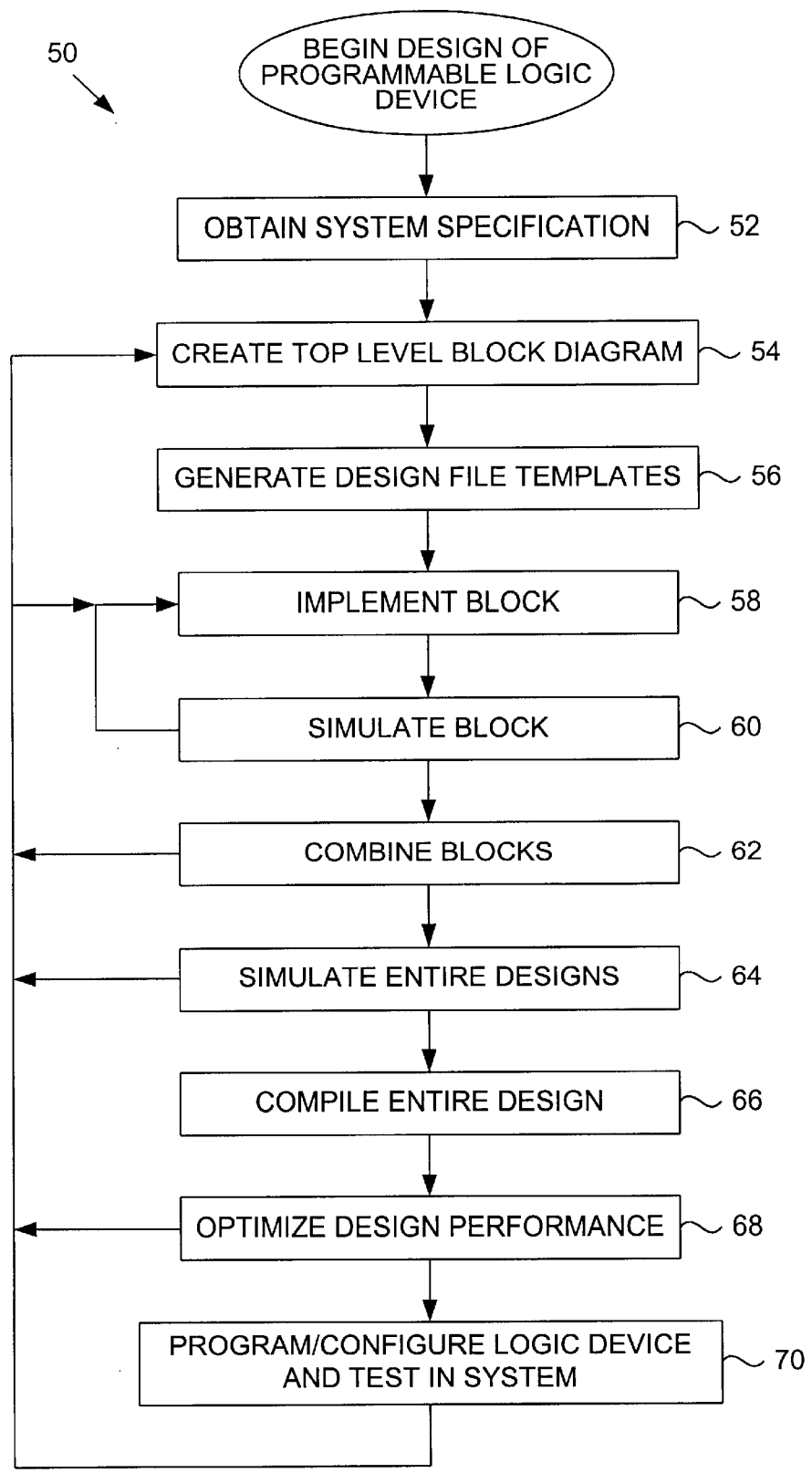
FIG. 2 is a flowchart of a design methodology used to design a programmable logic device according to one embodiment of the present invention.

FIG. 2 shows a design methodology 50 for using a system design specification in order to develop a design with which to program a PLD. It should be appreciated that the present invention may be practiced in the context of a wide variety of design methodologies. By way of example, the work group computing techniques and system of the present invention work well with an electronic design automation (EDA) software tool within the framework of the methodology of FIG. 2.

In step 52 a system specification for the PLD to be programmed is obtained. This specification is an external document or file that describes, for example, the device pin names, the functionality of each of the pins, the desired system functionality, timing and resource budgets, and the like. The multiple engineers within a work group will use this system specification in order to create a design with the EDA tool that will then be used to program a PLD.

Once the system specification is obtained, creation of a design using functional block diagrams is begun. In step 54 a top-level block diagram is created in which connections between lower-level designs blocks are specified. In this block, the target device, speed grade, and key timing requirements may be specified. Those skilled in the art will recognize that this top-level block may also include blocks that have already been developed or implemented or that have been obtained from a third party provider. This top-level block may also be converted into an HDL file, or the like, for use in other related design tools, such as an external simulator.

Step 56 includes generating design file templates with the EDA tool for all blocks present in the top-level block diagram of step 54. After the designer has created a block which has not yet been implemented, the system may generate a design file template. Such templates may display a block in a window format including, for example, a title, a date, etc. around the boundaries. It may also include some details of the functional content depicted within the window. The design file templates may be in any specified design format including VHDL, AHDL, Verilog, block diagram, schematic, or other like format. In the case of a VHDL block the template may also include much of the formatting and necessary syntax for any VHDL block. The user need only take the template and add the small portion of VHDL syntax required to implement his function. For example, the user may need only add syntax defining a particular AND gate operation. Normal design, such as VHDL or other IEEE standard, requires large amounts of text to adequately set up the design block.

Those skilled in the art will recognize that design file templates such as these can be used as starting points for the design of the structural or functional entities needed by the design. Thus, a design file template may serve as a reusable object for different instances of a block in one or more designs. More importantly, design file templates will be employed to reduce the amount of labor that the designer must expend to generate the logic in the blocks. In one embodiment, the generation of the design file templates is done in such a way that the templates can be updated later if the top-level block diagram changes.

Next, in step 58, each of the blocks of the top-level block is implemented using the EDA tool. It is noted that for more complicated designs, there may be additional levels of block diagrams (i.e., blocks within blocks). If changes are required at the top-level then the top-level block diagram is updated and the sub-designs are preferably automatically updated as well.

Furthermore, a block may be compiled through to a fitting stage for a particular integrated circuit die to provide information about resource utilization, timing performance, etc., as required for a given design. As such, it is envisioned that some timing optimization may be performed during step 58. This sequence illustrates a style of design in which an engineer first designs, then compiles and simulates, and then returns to design again if the simulation results are not satisfactory. In another style, an engineer may iterate through a number of design followed by simulation loops before finally compiling the complete design.

Concerning block implementation order, one or more of the following factors can be used to determine implementation order: (1) the complexity of a block; (2) the uncertainty or risk associated with a block; and/or (3) how far upstream and/or downstream in a given data-path the block resides. Each of steps 60, 62, 64, 68 and 70 may also lead back to this block implementation step for additional implementation necessitated by later changes in the design.

In step 60 a block is simulated functionally at the source level using a behavioral simulator and vectors generated by using a VHDL or Verilog test bench, for example. The simulation results can then be displayed or otherwise presented/recorded as waveforms, text or annotated onto the source files. The designer may also return to step 58 to implement a block again. Also, at this point a block may be compiled or a timing analysis performed.

Once the designer is satisfied with the simulation results, in step 62 the block is combined with other blocks and the resulting group is simulated together. In some cases, it may be useful to complete a full compilation to provide critical resource and timing information. Also, output simulation vectors from one block may become the input simulation vectors to the next block. The designer may also return to step 54 to modify the top-level block or to step 58 to implement a block again.

Next, in step 64, the entire design is simulated functionally at the source level using a behavioral simulator. Preferably, the top-level block diagram is fully specified before simulation and shows complete design connectivity. Vectors can be generated using a VHDL or Verilog test bench. Again, the simulation results can be displayed either as waveforms or annotated onto the source files. The designer may also return to step 54 to modify the top-level block or to step 58 to implement a block again. In step 66 the entire design is compiled through to a file containing the information needed to program a PLD to implement the user's design, such as to a "programming output file".

A wide variety of compile techniques may be used depending upon the type of design being created. By way of example, a few examples of compilation are presented below. For a PLD, compilation includes the steps of synthesis, place and route, generation of programming files and simulation. For a traditional integrated circuit design with a custom layout, compilation includes a layout version schematic, a design rule checker and simulations. For integrated circuit design using a high level design tool, compilation includes synthesis from a language such as VHDL or Verilog, automatic place and route and simulations. For printed circuit boards, compilation includes automatic routing, design rule checking, lumped parameter extraction and simulation. Of course, other types of compilation and variations on the above are possible.

Within the context of the present invention, any of the above compile techniques may be modified in order to produce an embedded logic analyzer. The compilation of a PLD is modified in order to insert a logic analyzer into a user's design.

Following compilation in step 66, in step 68 the timing checker inside the compiler is used to determine if the performance goals for the design have been met. Also, timing simulations are used to check performance details. In addition, other analysis tools such as a design profiler and/or layout editor can be used to further optimize the performance of the design. Preferably, optimization is not performed prior to step 68 because full compilation is usually required to establish the location of one or more critical paths within the design. The designer may also return to step 54 to modify the top-level block or to step 58 to implement a block again.

Next, in step 70 the device is programmed/configured using programming unit 14 and tested in the system. Again, the designer may also return to step 54 to modify the top-level block or to step 58 to implement a block again. While methodology 50 presents a top-down design process, it may also be used to support a bottom-up type methodology. Now that a general design methodology has been described by which an engineer may develop a design for a PLD, a technique for embedding a logic analyzer within a PLD will now be discussed.

Embedded Logic Analyzer and Software Debuggers

We now describe in general use of an embedded logic analyzer and a software debugger. An embedded logic analyzer within a PLD permits the capturing of desired signals and viewing the results on a host computer. Initially, a user generates a design for a device and compiles the design into an output file. A wide variety of EDA tools may be used to generate and compile a design for a PLD. Specific examples of how to use an embedded logic analyzer are described in U.S. Pat. Nos. 6,182,247 and 6,247,147 and U.S. patent application Ser. No. 09/186,607, filed Nov. 6, 1998, entitled "Enhanced Embedded Logic Analyzer" the entire disclosures of which are incorporated herein by reference for all purposes.

A compiled output file is used to program the device and the device is placed under operating conditions, such as on a printed circuit board or within a suitable electronic system. In one embodiment, if a user observes malfunctions with the device, a hardware debugging feature of the EDA tool is enabled. This enablement will allow the EDA tool to perform netlist augmentation. That is, the user's design in various design files may be augmented with a logic analyzer. The user is allowed to program the logic analyzer in order to debug the device in any way that the user chooses. The design for the logic analyzer may already be present within the EDA tool, or may be generated at any time. The signals of interest of the device to be monitored are specified by the user in order to track down the cause of the malfunction. The signals may be those present on pins of the device, or any internal signals or points within the device. Often the nature of the malfunction observed will provide a clue, suggesting signals that would likely provide further information about the problem. For example, if the malfunction is associated with data output at a particular pin, the signals to be monitored may be provided by logic upstream from the pin.

These signals to be monitored may be specified in a wide variety of ways. By way of example, a hierarchical path name for each signal may be specified, or a graphical user interface may be used to view a particular design file and to select a signal or point from within that file to be monitored. The user may also specify which pins of the device will be used as an interface to the user computer, i.e., those pins to be used to send control information to the embedded logic analyzer within the PLD and to upload captured information from the logic analyzer to the user computer. Preferably, though, the pins to be used as an interface are already known, such as a JTAG port of a device.

The user connects a debugging interface cable from the device to the user's computer. The interface cable may be the same cable used to program the device or it may be a dedicated cable for debugging. In one embodiment, the debugging cable connects to pins that have been specified by the user as being dedicated to the logic analyzer circuit. In other words, if the user has specified the pins to which the debugging cable will be connected, the cable should be connected to those pins. In an alternative embodiment, the user need not specify the "debugging pins," rather the system specifies them automatically. In other embodiments, a dedicated JTAG port of the device may be used.

The cable may attach directly to these pins, or, the signals from these pins may be routed to an easily accessible location or port on the board to which the debugging cable may easily attach. The cable will be used to transmit instructions from the computer to the embedded logic analyzer, and also to upload captured information from the logic analyzer to the computer.

The user through the EDA tool requests the embedded logic analyzer to begin running with an appropriate command. Once the logic analyzer begins to run, it begins to continuously capture data from the signals that have been specified to be monitored. Preferably, the user then manipulates the system to duplicate previous malfunctions that the user wishes to analyze. The captured data is stored within memory of the PLD, and is preferably stored within dedicated memory within the embedded logic analyzer itself. The logic analyzer determines whether the state of the signals specified to be monitored are equivalent to the breakpoint that the user has specified. If not, then the logic analyzer continues to capture data.

Once the total number of samples desired by the user have been captured and stored, the stored data is dumped from the sample memory of the logic analyzer to the user's computer. Preferably, the logic analyzer uploads this stored information over the interface cable to the user's computer. The user is able to graphically view these signals received from the logic analyzer. In one embodiment, the signals are presented in a waveform view annotated with the names of the signals. Thus, by viewing these signals of interest on a computer, a user is able to efficiently debug a hardware device in much the same way as if an external logic analyzer had been able to be connected to these signals.

Software debuggers operate in a similar manner to capture the state of executed instructions in an embedded processor. Once a breakpoint is reached, the user may examine the states of all registers and memories leading up to the system stoppage to obtain a more complete picture of the events leading to the system failure. A trace capture unit operating in combination with a main processor ideally may be used to capture the history of executed instructions prior to the triggering event. Analysis of the instructions executed immediately before the system stoppage is typically performed by software operating in the host computer. A more limited capture of instructions may be obtained in the absence of a trace unit by reading values stored by the processor for this purpose at unused memory and register locations.

As noted, sometimes trace modules are integrated into the microcontroller to capture the history of instructions executed by the processor. One such trace module suitable for use with ARM processors is an ETM9 trace module available from ARM Limited. ARM provides hard core processors and associated tools to semiconductor chip manufacturers for integration into their chips. The ETM9 trace module provides instruction and data tracing capability for the ARM-based family. The ETM (connects directly to a trace interface on the embedded processor. Altera Corporation of San Jose, Calif., uses hard core implementations of processors from ARM-Limited as well as from MIPS Technologies, Inc. in its Excalibur embedded processor PLD systems. Thus, an implementation of the present invention in Altera's Excalibur embedded processor PLD systems uses debugging tools that support ARM-based and MIPS based processors.

PLD System

Figure 3:
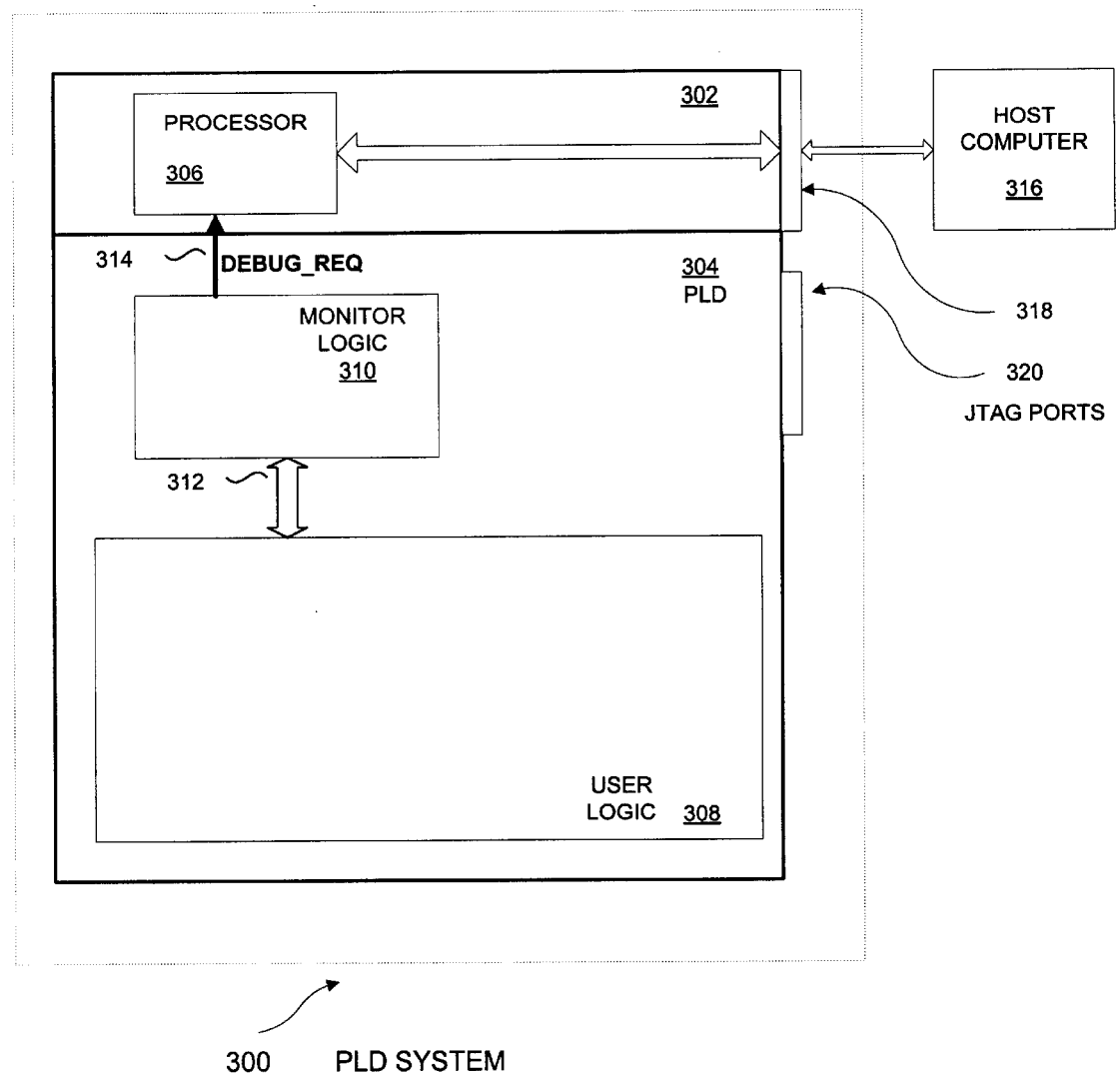
FIG. 3 is a block diagram of a programmable logic device system transmitting a control signal from the PLD portion to the microcontroller according to one embodiment of the present invention.

FIG. 3 illustrates a programmable logic device system in accordance with one embodiment of the present invention. The PLD system 300 comprises a microcontroller portion 302 and a PLD portion 304. The microprocessor 306 is contained within microcontroller 302. The microcontroller may typically contain the processor core, peripherals, and memory subsystem. An example of a PLD system 300 combining a PLD portion and a microcontroller portion is Altera's Excalibur family of ARM-based embedded processor PLD's. An example processor suitable for practicing the embodiments of the present invention is the ARM922T. The ARM922T is a member of the ARM-9 Thumb family of processors, with Harvard architecture (separate memories for instructions and data) implemented using a five-stage pipeline. Such an implementation allows single clock-cycle instruction operation through simultaneous fetch, decode, execute, memory, and write stages. These processor features provide performance advantages but require synchronization as described in the present invention to effectively debug the PLD system.

The PLD portion contains both user logic 308 and a monitoring logic block 310. section. The user logic 308 generally comprises the application hardware. This logic is configured through the EDA tools and design methods described above. The designer generally will strive, through the use of the EDA tools, to incorporate those functions of the electronic design most suitable for implementation in the soft logic of the PLD portion into that portion. He or she will program the microprocessor 306 through high level hardware development languages such as C and C++ in accordance with methods well known to those of skill in the art. User logic 308 is connected by a connection network 312 of connection lines between the user logic 308 and the monitoring logic 310.

The monitoring logic 310 may comprise a specialized hardware circuit designed for the particular electronic design application to generate an appropriate signal for transmission across signal line 314 to the microcontroller portion 302. In many cases, a single bit signal would be suitable for this purpose. Generally, the monitoring logic is configured to detect conditions within the PLD portion which might, for example, indicate a fault in the PLD portion of the circuit and generate a signal for transmission to the microprocessor 306 to indicate that a debug mode should be entered, which stops the processor. This allows examination of an instruction trace if so equipped. The signal may also be generated when a breakpoint is reached in a soft processor implemented in the PLD portion or when an internal state machine in the PLD portion reaches a selected state and generally is transmitted to stop the processor. In this way the PLD portion can exert debug control over the processor. In yet another embodiment, two chips may be configured so that one processor stops when the second processor, such as one located on another chip, stops or reaches a breakpoint. In a further refinement, both processors may be interconnected so that reaching a breakpoint on either processor causes the other processor to stop.

Signal line 314 (DEBUG_REQUEST) provides a direct electrical connection between microcontroller portion 302 and the PLD portion 304 for transmission of a signal upon the occurrence of a condition in the PLD portion 304 requiring a debug action in the processor. Methods of forming such a connection between a microcontroller portion containing an embedded processor and another portion on the same chip (such as a PLD) are well known in the art, and one of ordinary skill would know how to adapt them to constructing a PLD system in accordance with the present invention, given the parameters provided herein.

In this embodiment, the PLD portion is configured to transmit signal 314 across the signal line upon the occurrence of some event in the PLD portion as detected by the monitoring logic 310. In an alternate embodiment, the signal generated may be provided from a portion of the user's circuit design which becomes active under some conditions in the normal operation of the circuit. In yet another embodiment, transmission of the debug request sugnal over signal line 314 ocurs when a certain state in a state machine is reached. Configuration of logic in such manner may be accomplished in accordance with techniques well known to those of skill in the art. As noted earlier, designs entered into the programmable logic portion of the system are typically entered using hardware description languages. In addition, many designs which can be integrated into the PLD logic are available commercially. For example, intellectual property cores such as designs incorporating embedded logic analyzers (e.g., a Signal Tap product) are available from Altera Corporation for use in its programmable logic devices.

In another embodiment, the monitoring logic 310 includes an embedded logic analyzer, such as, for example, the embedded logic analyzer described earlier in this specification. One such embedded logic analyzer suitable for use in this application is the Signal Tap embedded logic analyzer sold by Altera Corporation. Embedded logic analyzers may be programmed to output such a triggering signal 314 upon the occurrence of a particular states, for example in a simplified model, when nodes A and B contain high values AND registers C and D have low values. The reason a signal 314 is being output is generally to stop the processor to help the user to debug the PLD system when it has reached the state in which errors may occur or have just occurred.

Debugging software is typically run on a host computer 316 connected through JTAG ports 318 and 320 to the microcontroller portion 302 and PLD portion 304 respectively. These ports (318 and 320) are also used for configuring the PLD portion 304 and programming the microprocessor portion 302. Programming and user debugging control may alternatively be provided through a single JTAG port, such as either 318 and 320, in serial fashion. That is, the debugging commands could first be provided to the microcontroller portion 302 through the JTAG port followed by debugging commands for the PLD portion 304, or in the reverse order.

PLD's may also be configured with one or more processors in the PLD portion 304. These are referred to as soft processors. In such embodiments, the processor instruction execution may be debugged by a software debugger connected to the soft core processor in the PLD portion 304. In software debugging, breakpoints may be entered into the execution stream through the use of a debugger to order halting of execution of the instructions immediately after the breakpoint is reached. In some systems breakpoints can be configured to allow execution of instructions to continue but result in the sending of a signal such as signal 314 upon the instruction stream reaching the breakpoint. In another embodiment, the PLD portion 304 comprising a soft core processor is configured to transmit signal 314 once a breakpoint is reached in the soft processor's execution of instructions. PLD portion 304 and the soft processor may also be configured to send a signal 314 upon reaching a breakpoint which stops execution of instructions by the soft processor. This provides the capability of stopping the hard core microprocessor 306 at or about the same time that program execution stops in the soft core processor. Processor 306 is able to be stopped because signal 314 (DEBUG_REQ) is routed to the processor which is configured to enter a debug mode when a signal is received.

Figure 4:
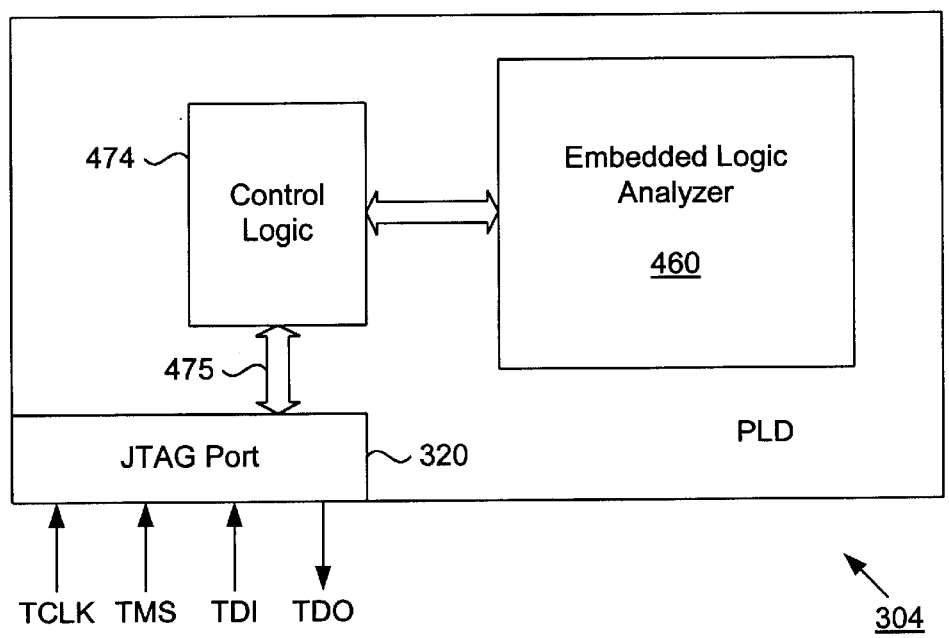
FIG. 4 illustrates an embedded logic analyzer according to one embodiment of the present invention.

FIG. 4 illustrates another view of a PLD portion 304 showing a preferred embodiment for controlling a logic analyzer using the JTAG port of the device in which the logic analyzer is embedded. Not shown for clarity within PLD portion 304 is user logic 308. In this preferred embodiment, interface signals 264 are implemented using a JTAG port 320 in conjunction with control logic 474 and signals 475. A JTAG (Joint Test Action Group) port 320 is implemented under the IEEE 1149.1 standard and is known to those of skill in the art. Control logic 474 provides buffering between logic analyzer 460 and JTAG port 320 for particular signals that are described below in FIG. 7. More specifically, control logic 474 supplies control signals to logic analyzer 460 and assists with retrieving data and status from the logic analyzer.

In this embodiment, JTAG port 420 includes signals TCLK, TMS, TDI and TDO. Signal TCLK is a clock signal that controls the rate of serial data in and out of JTAG port 420. Signal TMS is a mode select signal that selects any of the sixteen states of the JTAG port. Signals TDI and TDO are serial data in and serial data out, respectfully.

Typically, a JTAG port is used either to program a PLD or to assist with testing a circuit board on which PLDs are located. Advantageously, it is realized that a JTAG port has traditionally been unused during the design and debugging of a particular PLD. Thus, it is further realized that a JTAG port on a PLD is under utilized and may be used during debugging of a PLD as a means of communicating with and controlling an embedded logic analyzer of the present invention. Advantageously, a standard JTAG port is used to facilitate debugging of a programmable logic device that includes an embedded logic analyzer.

As described above with reference to FIG. 4, a preferred embodiment of the invention uses JTAG port 320 or ports 318 and 320 along with control logic 274 and signals 275 for controlling logic analyzer 460 and trace module 702. It is realized that use of a: JTAG port for control of a logic analyzer would be advantageous in that a JTAG port is often already present on a PLD and present in the microcontroller. The use of a JTAG port obviates the need to add extra, dedicated debugging control pins. Furthermore, many manufacturers of PLDs already have facilities for connecting and communicating through a JTAG port of a PLD. For example, Altera Corporation of San Jose, Calif. uses a product known as "Byte Blaster" to program a PLD through a JTAG port. For these reasons and others, it is realized that use of a JTAG port to control an embedded logic analyzer and an embedded processor would be advantageous. Advantageously, a JTAG port is used to control the embedded logic analyzer while the PLD in which the logic analyzer is embedded is allowed to operate on the circuit board in a real-world environment. Further details as to the operation of the JTAG port are provided in U.S. Pat. No. 6,247,147, entitled "Enhanced Embedded Logic Analyzer" which is herein incorporated by reference.

Figure 5:
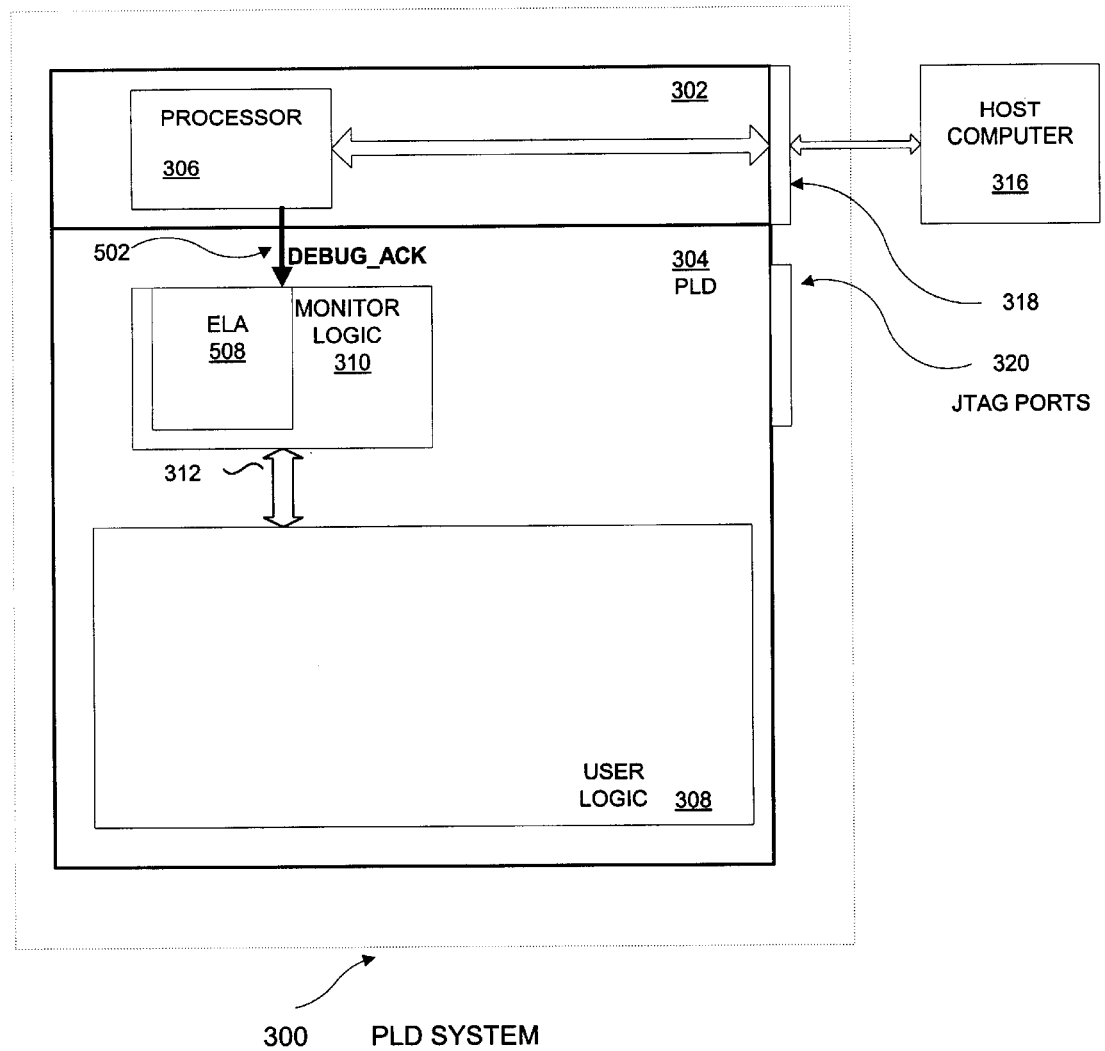
FIG. 5 is a block diagram of a programmable logic device system transmitting a control signal from the microcontroller to the PLD portion according to one embodiment of the present invention.

FIG. 5 illustrates a programmable logic device system 300 transmitting a signal 502 (DEBUG_ACKNOWLEDGE) from a microcontroller portion 302 to a PLD portion 304 in accordance with one embodiment of the present invention. A software debugging program operating on host computer 316 may be used to insert breakpoints in the instruction stream of microprocessor 306. A breakpoint requires the processor to stop executing instructions and go into a debug mode. A watchpoint makes the processor stop executing instructions and enter a debug mode because the processor is about to access data at a particular location. Some systems may be configured so that breakpoints and watchpoints send a signal without shutting down the execution of instructions.

In both embodiments, the microcontroller portion may be configured to transmit such a signal across signal line 502 upon reaching a breakpoint according to methods well known to those of skill in the art. The signal is transmitted across signal line 502 to the PLD portion 304 to create events in the PLD portion to help debug the system. In one embodiment it is received in the embedded logic analyzer 508. In one embodiment, the embedded logic analyzer may be configured such that it is triggered upon receipt of the signal. Altera's Excalibur embedded processor PLD systems incorporate such a signal line into the PLD from the microcontroller and designate the line in its specifications as DEBUG-ACK, as referenced in FIG. 5. Embedded logic analyzer 508 is shown located within monitor logic block 310. Monitoring logic such as embedded logic analyzer 508 permit the capturing of information such as the states of selected points within the PLD portion 304. Though logic analyzers perform such functions well, specialized monitoring logic could easily be configured within the monitor logic block 310 or other portions of PLD portion 304 and still fall within the spirit and intent of this invention. One advantage of user specific monitoring logic is that the custom design may minimize the area of the PLD devoted to such monitoring as compared to a larger area taken up by an embedded logic analyzer. The specialized monitoring logic may provide greater versatility than provided by embedded logic analyzer functions.

Embedded logic analyzers such as the Signal Tap product produced by Altera Corp. of San Jose, Calif. are capable of performing pre-trigger capture and post-trigger capture. In pre-trigger mode the embedded logic analyzer captures and stores state data for the PLD after the trigger signal is received whereas post-trigger mode refers to captured and stored state data immediately prior to the trigger. In some cases, logic analyzers may implement more sophisticated functions such as a 90% trigger, where 90% of the data is before the trigger and 10% after the trigger so that all the desired data up to the trigger signal is obtained and a little after it. In alternate embodiments of the present invention, pre-trigger captures and post-trigger captures are selected so that the time period for which data is captured in the PLD corresponds to the time period in which the user is interested. For example, if an event is triggered in the processor by the system having just performed incorrectly (e.g. a fault occurred), a post trigger capture in the PLD would be selected to ensure that the PLD capture data covers the period leading up to the time of the fault.

In another embodiment, the signal generated by the microprocessor portion 304 is connected to a state machine in the PLD portion 304 and triggers the running of the state machine. Inputting such a signal may be used to allow the PLD to capture some of its state, such as for later analysis. In yet another embodiment, the debug acknowledge signal sent across signal 502 stops a soft processor configured in the PLD portion at the same time that the processor is stopped. The same signal may be sent to another processor located off the chip. This embodiment would permit the simultaneous stoppage of the processor and the second processor to provide more complete system state information during debugging.

Although signal 502 is shown connected to an embedded logic analyzer 508 in monitoring logic 310, the invention is applicable to other logic configurations designed for debugging. For example, the PLD portion may be configured by the designer to capture state signals for predetermined portions of logic in the PLD section upon receipt of the signal. In other embodiments, the specialized logic may be configured to maintain the current state of predetermined sections of logic in the PLD portion until a restart signal is provided. Restart may be provided by a second signal line or serially provided over the same line by methods well known to those of skill in the art. Maintaining the state of selected points within the PLD is useful to permit debugging of the processor's instructions.

Normally when a breakpoint is reached in the processor instruction execution, the execution halts but may be restarted. In the absence of such a control signal to the PLD portion, the PLD logic would keep running and in some cases the sequence of microcontroller and PLD operations could not be properly be restarted after the breakpoint. For example, the system might enter into an incorrect state if the processor instructions depended upon an input value from the PLD portion which is only valid for a few clocks and which would otherwise be overwritten if the processor stopped. For example, if a PLD configured to sample is not stopped, it will continue resampling and the user will lose the data collected before. Thus, use of signal line 502 is advantageous because it permits a complete picture of the microprocessor instruction sequence at the time of a breakpoint and a picture as to state information for selected points in the PLD portion at the same time. Moreover, it also permits the halting of instructions in the processor after reaching a breakpoint to produce a similar maintenance of states in the PLD portion so that the entire system may be restarted as the user "steps" through the breakpoints of the processor instructions during debugging.

The foregoing embodiments have described various techniques as to how the PLD can exert control over the microprocessor by using the DEBUG_REQ line and how the processor can exert control over the PLD by the DEBUG_ACK line. Other lines may be used to perform the same control functions but in a more complex way. For example, using 2–4 lines, such as EXT_0 and EXT_1 lines, as implemented in one embodiment of Altera's Excalibur embedded processor PLD systems, the processor will be signaled to go into a debug mode if one of the EXT lines is asserted and another condition holds true such as a breakpoint or watchpoint is triggered. For example, in the Excalibur system, there are 2 breakpoint units in the processor and each uses one of the EXT qualifying lines.

Figure 6:
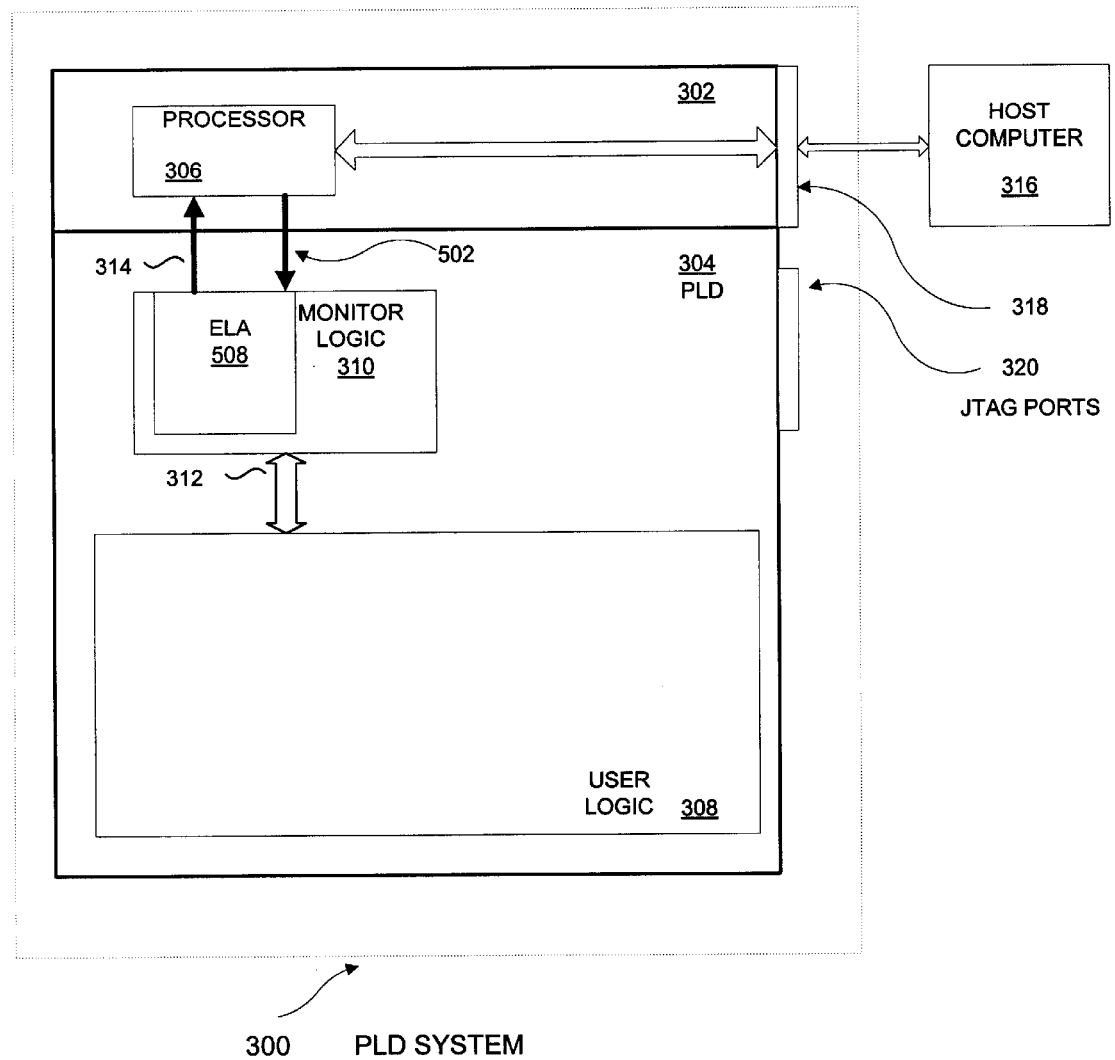
FIG. 6 is a block diagram of a programmable logic device system transmitting control signals between the microcontroller and the PLD portion according to one embodiment of the present invention.

As illustrated in FIG. 6, two signal lines may be used to coordinate the length of the captured debug data (traces) in the processor and the PLD. Initially, the microprocessor may hit a breakpoint in the debug process and transmit a signal over line 502 to the monitor logic block 310 of the PLD 304. The breakpoint may be a breakpoint which allows the processor to continue with execution of instructions while the embedded logic analyzer or other specially configured monitoring logic in the PLD portion 304 completes its scan. Signal line 314 transmits a signal to the microcontroller portion 302 after completion of its capture of state information. The microcontroller portion may be further configured to stop program execution upon receipt of the second signal. This embodiment is useful to capture complete state information for the system over an extended time period. For example, a trace of instructions over a 5 ms period may be captured and output to the host computer using the debugging in the processor while a timed 5 ms state scan of selected points in the PLD portion also is captured and forwarded to the host computer through the PLD's debug software. Thus, the trace in the PLD portion would coincide with a period of interest traced in the processor. In yet another embodiment, the PLD portion may be configured upon receipt of the signal from the processor across signal line 502 to safely terminate the operation of equipment controlled by the processor. This embodiment would be useful in many circumstances to permit a limited function circuit in the PLD portion to take over control of a task performed by the microprocessor, thus enabling debugging of the microprocessor to occur. For example, in the absence of such a circuit in the PLD portion, a crane operated by a microprocessor might drop its load when debugging stopped the microprocessor. This embodiment is applicable to all types of tasks controlled by a microprocessor wherein stopping the processor during debugging may create safety problems in the absence of backup circuitry provided by the PLD portion.

Figure 7:
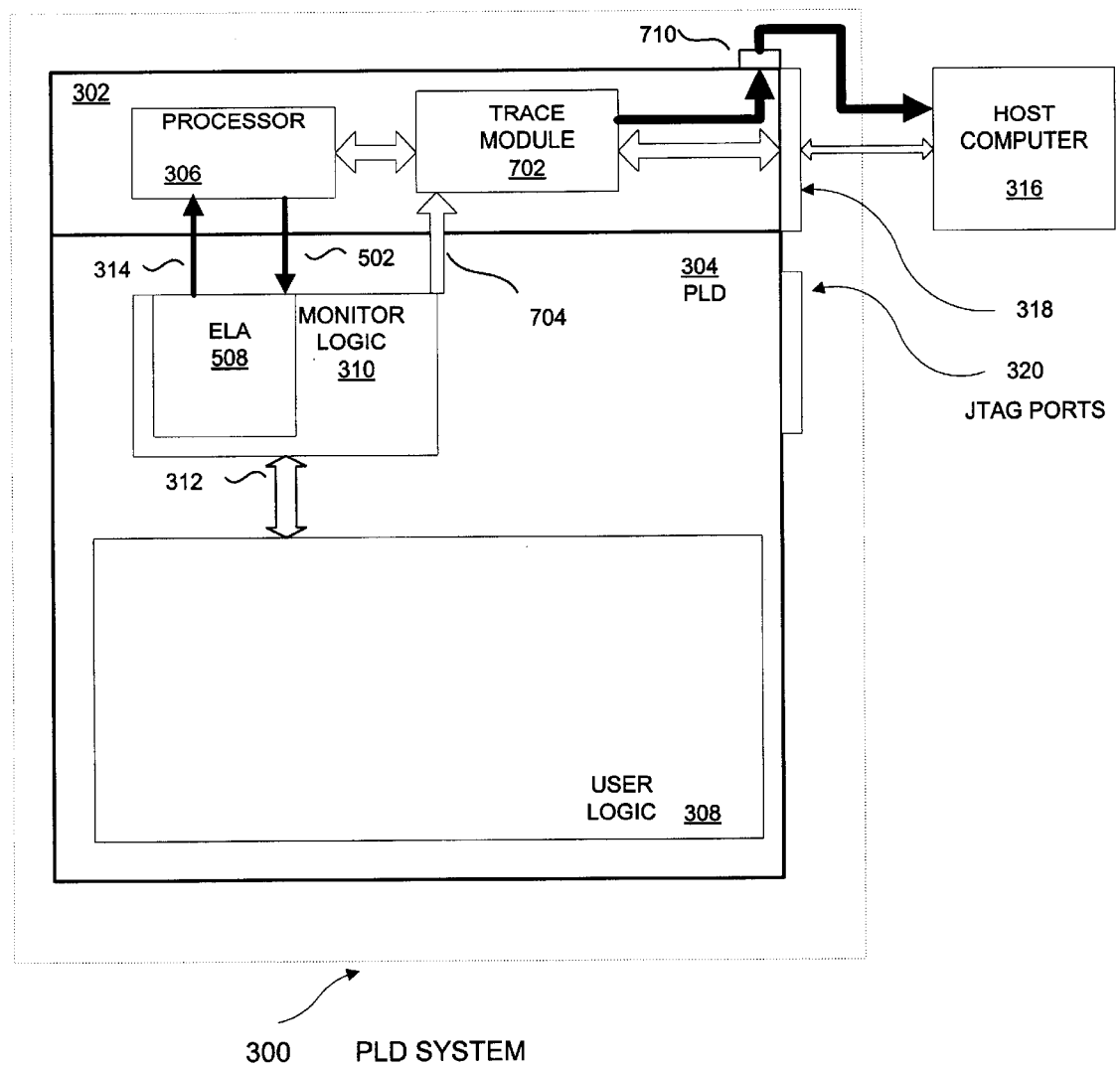
FIG. 7 is a block diagram of a programmable logic device system having a trace module in the microcontroller portion according to one embodiment of the present invention.

As illustrated in FIG. 7, the PLD system may comprise a trace module 702 within the microcontroller portion 302 in accordance with one embodiment. The trace module monitors the microprocessor's 306 execution of instructions, compresses the information, and outputs it through a trace port 710 of the PLD system to host computer 316. The trace module 702 performs functions for the processor 306 and its software instructions similar to those debugging functions by embedded logic analyzers in the PLD portion. Trace module 702 monitors a signal line 704 from the PLD portion 304 and summarizes changes appearing on line 704 as well. Although the line from the PLD portion to the trace module 702 may be a single line, a multi-bit bus such as a 4-bit bus provides greater information and is preferable. The size of the line or bus selected is determined by the width of the data sought and the number of connections available on trace module 702 for input. For example, an ETM-9 trace module is available from ARM Technologies, Ltd. for use with the ARM family of embedded microprocessors. Such a module implemented on Excalibur family of chips available from Altera uses a 4 bit bus input from the PLD portion and designated as EXT-IN [3 . . . 0]. The bandwidth provided by a 4-bit bus, for example, permits a counter to be implemented in PLD portion 304, or more specifically in one embodiment, in an embedded logic analyzer 508. The last 4 bits of the counter, for example bits 8 . . . 11 of a 12-bit counter, may be connected to the trace module 702.

The present invention in one embodiment uses the output from the counter over signal line 704 to synchronize the captured PLD portion states from the embedded logic analyzer with the captured and stored instructions from the embedded microprocessor 306. In other words, the signals transmitted across signal line 704 makes the PLD portion clock or operations visible to the trace module. The concurrent storage of the signals received by the trace module 702 from the embedded logic analyzer 508 will thus permit a timestamping on the executed instruction trace. Although typically the clock rates for the PLD portion and the microcontroller portion are different, this timestamping function will permit the synchronization of the captured information (traces) from each of the microcontroller portion 302 and PLD portion 304 by software in the host computer 708. Such software is projected to "stretch" one of the traces to match the other trace and may be performed with techniques well known to those of skill in the art. Synchronization is also important because even with signals coordinated to shut down the processor and freeze the PLD portion at the same time, the stopping points will generally differ by several cycles. Software in the host computer may perform the synchronization of the traces from the embedded logic analyzer and the trace module in the microcontroller portion. The synchronized traces might appear as two traces side by side with the synchronization points indicated. Alternately, the trace might appear as a typical embedded logic analyzer trace with the instructions appended. As noted earlier, debugging software for both processors and embedded logic analyzers and designed to be run on external host computers are commercially available.

In an alternate embodiment, the signal from the PLD portion may be generated by an event occurring within the PLD or the embedded logic analyzer. For example, the PLD portion may contain internal nodes which reach a selected value only when a fault in the system is approaching. This value would permit synchronization between the two traces by effecting an "event stamping" in the trace module 702, similar to the "time stamping" as described above with reference to the output of a timer in the PLD portion 304. In yet another embodiment, a state machine may be configured in the PLD portion to generate signal 704 connected to the trace module 702. For example, as known to those of skill in the art, a state machine having 8 states may be represented by a 3-bit signal. Thus, a 3-bit signal line 704 may be used to synchronize the traces, taking outputs from the flip flops of the state machine. Thus, the trace module 702 may be used to produce a representation of everything occurring in the processor simultaneous with each state of the state machine.

One embodiment of the present invention is provided by the Excalibur family of embedded processors available from Altera Corporation, San Jose, Calif. The Excalibur family provides a choice of processors, programmable logic, and memory on a single PLD. Three embedded processor families available include an ARM-based processor core provided by ARM limited, a MIPS-based RISC processor core provided by MIPS Technologies, Inc., and Altera's Nios soft core RISC embedded processor. Altera provides all of the tools necessary for development of Excalibur designs, including a C/C++ compiler and debugger, peripherals and drivers, the Quartus software for PLD design development, and download cables for device programming and verification. These tools provide a system-centric approach to development, allowing hardware and software to be created in unison.

The Nios embedded processor is a configurable RISC soft core processor with a 16-bit instruction set and user-selectable 16 or 32-bit data paths. Software development support for the Nios soft core processor is provided by the GNUPro compiler and debugger from Cygnus Software, a division of Red Hat, Inc. It is an open source C/C++ development tool suite which provides debugging. The Nios soft core processors may also be used in conjunction with hard core processors embedded in the processor core such as the ARM- and MIPS-based embedded processors.

Although the foregoing invention has been described in some detail for purposes of clarity of understanding, it will be apparent that certain changes and modifications may be practiced within the scope of the appended claims. For instance, the connections between the PLD circuitry and the microcontroller may be varied in number, name, and techniques for forming them without departing from the spirit and intent of this invention. The configurations of the PLD and the microcontroller have been described generally with respect to the portions appearing in a single chip but the invention is equally applicable to systems where the portions appear on separate chips. Also, the present invention is applicable to any type of EDA tool that is able to compile a user design. Although limited examples of PLD system configurations have been presented, variations on the configuration of logic within the PLD portion and the configuration of the microcontroller and trace modules may occur depending upon the device for which the design is being compiled and still take advantage of the present invention. Furthermore, the specific logic analyzer circuit shown is exemplary; other circuits may also be used to implement a logic analyzer. An interface to the logic analyzer and to a trace module from a computer may use any number of pins and any type of protocol such as serial, parallel, etc. A JTAG port may control one or more embedded logic analyzers or trace modules, or separate ports may be used for each. Therefore, the described embodiments should be taken as illustrative and not restrictive, and the invention should not be limited to the details given herein but should be defined by the following claims and their full scope of equivalents.

We claim:

1. A programmable logic device ("PLD") system comprising:
   a programmable logic device ("PLD") portion having programmable logic circuitry representing one iteration of an electronic design in a design process to create a final PLD portion;
   a microcontroller portion having a microprocessor; and
   a signal line connected between the microcontroller portion and PLD portion to transmit debug control information between the microcontroller portion and the PLD portion, wherein the system is configured to use the signal line to synchronize instruction traces on the microprocessor with logic traces from the PLD portion.

2. The PLD system as recited in claim 1 wherein the PLD portion is configured to transmit a signal across the signal line and the microcontroller portion is configured to respond to a signal received from the signal line.

3. The PLD system as recited in claim 2 wherein the microprocessor enters into a debug mode.

4. The PLD system as recited in claim 2 wherein the microprocessor stops executing instructions.

5. The PLD system as recited in claim 3 wherein the PLD portion comprises specialized debugging logic to generate the signal.

6. The PLD system as recited in claim 5 wherein the PLD portion comprises an embedded logic analyzer configured to generate the signal upon the occurrence of a predetermined condition.

7. The PLD system as recited in claim 6, further comprising:
   a JTAG (Joint Test Action Group) port arranged to receive at least one of logic analyzer and software debugging commands from outside said PLD portion and said microprocessor portion; and
   means for performing the function of controlling said logic analyzer using said JTAG port of said PLD system, whereby said logic analyzer receives said commands from outside said PLD portion and said microprocessor portion and operates in response to said commands.

8. The PLD system as recited in claim 2 wherein the PLD portion comprises a state machine and the signal is generated when the state machine reaches a predetermined state.

9. The PLD system as recited in claim 2 further comprising a second processor located on another chip and configured to transmit debug control information to the microprocessor.

10. The PLD system as recited in claim 3 wherein the signal is a signal in a user logic circuit in the PLD portion which becomes active in the normal operation of the circuit.

11. The PLD system as recited in claim 3 wherein the PLD portion comprises a soft processor and the signal is generated by the soft processor after a breakpoint is reached.

12. The PLD system as recited in claim 1 wherein the PLD portion and the microprocessor are fabricated on the same chip.

13. The PLD system as recited in claim 1 wherein the microcontroller portion is configured to transmit a signal across the signal line when program execution reaches a breakpoint and the PLD portion is configured to respond to a signal received from the signal line.

14. The PLD system as recited in claim 13 wherein the program execution stops when a program executing in the microprocessor reaches a breakpoint.

15. The PLD system as recited in claim 13 wherein a coprocessor in the PLD portion is configured to stop upon receipt of the signal.

16. The PLD system as recited in claim 13 wherein an embedded logic analyzer in the PLD portion is triggered upon receipt of the signal.

17. The PLD system as recited in claim 16 wherein the embedded logic analyzer in the PLD portion is configured to perform a pre-trigger capture of data.

18. The PLD system as recited in claim 16 wherein the embedded logic analyzer in the PLD portion is configured to perform a post-trigger capture of data.

19. The PLD system as recited in claim 13 wherein a state machine in the PLD portion is triggered upon receipt of the signal.

20. The PLD system as recited in claim 13 wherein the PLD portion is configured to capture the states of predetermined sections of logic in the PLD portion upon receipt of the signal.

21. The PLD system as recited in claim 13 wherein the PLD portion is configured to maintain the current state of predetermined sections of logic in the PLD portion, upon receipt of the signal for the duration of the signal.

22. The PLD system as recited in claim 13 wherein the PLD portion is configured to perform a safe shutdown of equipment operated by the microcontroller.

23. The PLD system as recited in claim 16 further comprising a second signal line connected between the microcontroller portion and PLD portion to transmit debug control information between the microcontroller portion and the PLD portion, wherein the embedded logic analyzer is configured to capture states of predetermined logic upon triggering and to transmit a signal over the second signal line to the processor portion and the microcontroller portion is further configured stop program execution upon receipt of the second signal.

24. A programmable logic device ("PLD") system comprising:
   a programmable logic device ("PLD") portion having programmable logic circuitry representing one iteration of an electronic design in a design process to create a final PLD portion;
   a microcontroller portion having a microprocessor and a trace module configured to capture and store the microprocessor's execution of instructions; and
   a signal line connected between the trace module and PLD portion to communicate debug control information between the microcontroller portion and the PLD portion; wherein the PLD portion is configured to transmit a signal across the signal line and the trace module is configured to respond to the signal received from the signal line.

25. The PLD system as recited in claim 24 wherein the trace module responds to the signal received by synchronizing the signal with the capture and storage of the microprocessor's execution of instructions.

26. The PLD system as recited in claim 25 wherein the PLD portion is configured to generate the signal from a counter within the PLD portion and the signal is a multi bit signal.

27. The PLD system as recited in claim 26 wherein the PLD portion further comprises an embedded logic analyzer and the counter is located within the embedded logic analyzer.

28. The PLD system as recited in claim 24 wherein the PLD portion is configured to generate the signal from an event occurring within the PLD portion.

29. The PLD system as recited in claim 24 wherein the PLD portion further comprises an embedded logic analyzer and is configured to generate the signal from an event occurring within the embedded logic analyzer.

30. The PLD system as recited in claim 24 wherein the PLD portion is configured to generate the signal corresponding to a state in a state machine.

31. A method for debugging a programmable logic device (PLD) system comprising a microcontroller portion and a PLD portion, said method comprising:
   compiling an electronic design to produce a complete design file;
   programming said PLD portion with said complete design file;
   connecting the PLD portion and the microcontroller portion by a signal line to synchronize debug data comprising instruction traces for the microcontroller portion and logic traces for the PLD portion;
   connecting a JTAG (Joint Test Action Group) port of said PLD system to monitor logic in the PLD portion and the microcontroller portion; and
   controlling said monitoring logic and microcontroller portion, whereby said PLD system may be debugged.

32. The method as recited in claim 31, further comprising transmitting debug control information from the PLD portion to the processor.

33. The method as recited in claim 32, wherein the PLD portion is configured to transmit a signal across the signal line and the microcontroller portion is configured to respond to a signal received from the signal line.

34. The method as recited in claim 33, wherein the PLD portion comprises an embedded logic analyzer configured to generate the signal upon the occurrence of a predetermined condition.

35. The method as recited in claim 31, further comprising transmitting debug control information from the microcontroller portion to the PLD portion.

36. The method as recited in claim 35, wherein the microcontroller portion is configured to transmit a signal across the signal line when program execution reaches a breakpoint and the PLD portion is configured to respond to a signal received from the signal line.

37. A method for debugging a programmable logic device (PLD) system containing a microprocessor and a PLD portion, said method comprising:
   compiling an electronic design and inserting a logic analyzer and a trace module to produce a complete design file;
   programming said PLD portion with said complete design file, said logic analyzer being embedded in said PLD portion;
   receiving captured data from said logic analyzer of said PLD portion, whereby said PLD portion may be debugged;
   receiving captured instruction traces for at least the microprocessor from said trace module, whereby said microprocessor may be debugged; and
   synchronizing the captured instruction traces from the trace module and the captured data from said logic analyzer.

38. The method as recited in claim 37, wherein the captured data from said logic analyzer are received via a JTAG port.

39. The method as recited in claim 37, wherein the captured trace instructions are received via a trace port.

* * * * *